United States Patent [19]

Klersy et al.

[11] Patent Number: 5,177,567
[45] Date of Patent: Jan. 5, 1993

[54] THIN-FILM STRUCTURE FOR CHALCOGENIDE ELECTRICAL SWITCHING DEVICES AND PROCESS THEREFOR

[75] Inventors: Patrick J. Klersy, Madison Heights; David C. Jablonski, Waterford; Stanford R. Ovshinsky, Bloomfield Hills, all of Mich.

[73] Assignee: Energy Conversion Devices, Inc., Troy, Mich.

[21] Appl. No.: 732,544

[22] Filed: Jul. 19, 1991

[51] Int. Cl.⁵ .................... H01L 45/00; H01L 27/02
[52] U.S. Cl. ............................... 257/4; 257/3; 257/760
[58] Field of Search ............ 357/2, 4, 56, 80, 81, 357/67, 68, 51

[56] References Cited

U.S. PATENT DOCUMENTS

| | | | |
|---|---|---|---|
| 3,611,063 | 10/1971 | Neale | 357/4 |
| 3,846,767 | 11/1974 | Cohen | 357/2 |
| 4,599,705 | 7/1986 | Holmberg et al. | 357/2 |
| 4,804,490 | 2/1989 | Pryor et al. | 357/2 |
| 4,809,044 | 2/1989 | Pryor et al. | 357/2 |
| 4,845,533 | 7/1989 | Pryor et al. | 357/2 |

Primary Examiner—Rolf Hille
Assistant Examiner—Mahshid Saadat
Attorney, Agent, or Firm—Marvin S. Siskind

[57] ABSTRACT

Disclosed herein is a novel thin-film structure for solid state thin-film electrical switching devices fabricated of chalcogenide material that overcomes a number of design weaknesses existing in the prior art. The novel structure of the instant invention employs a thin layer of insulating material beneath the body of chalcogenide material so as to carefully define the filament location. Since the filament location has been fixed, switching, due to edge conduction pathways has been substantially eliminated. At the same time, the use of a thin insulating layer precludes step coverage faults of the prior art. The requirement for the thin layer of insulator material to withstand the switching voltage is addressed through the use of a second thicker layer of insulator material which is deposited only after the chalcogenide material has been formed. This improved structure demonstrates the advantages of higher fabrication yields and more repeatable electrical switching characteristics.

19 Claims, 3 Drawing Sheets

THIN-FILM STRUCTURE FOR CHALCOGENIDE ELECTRICAL SWITCHING DEVICES AND PROCESS THEREFOR

STATEMENT REGARDING FEDERALLY SPONSORED RESEARCH

This invention was made with Government support under Contract No. DNA-90-C-0048 awarded by the Defense Nuclear Agency.

FIELD OF THE INVENTION

The present invention relates generally to solid state memory and threshold switches fabricated from thin-film chalcogenide and, more particularly, to a novel structure for the fabrication of said chalcogenide switches which reduces, if not eliminates, the problem of edge conductivity inherent in prior art structures.

BACKGROUND OF THE INVENTION

Threshold and memory switching devices containing a body of chalcogenide material were invented by S. R. Ovshinsky at Energy Conversion Devices (ECD) and used since the 1960's. Such switching devices typically included a pair of spacedly disposed electrodes with an active chalcogenide material therebetween. The type of switching device thereby formed (i.e., threshold or memory) depended upon the particular composition of chalcogenide material used.

The basic structural and operational characteristics for threshold and memory devices are set forth hereinafter. Each type of device is similar to the others in most structural aspects, however, their respective operational characteristics differ greatly.

In regards to structure, each device is basically a body of material which is reversibly electrically switchable from one detectable ohmic state to a different detectable ohmic state. This body of material is typically connected in an electrical circuit by means of a pair of electrodes placed on either extremity of the body of material.

Structurally, each device differs from the other in only a few key aspects, such as diameter and composition of the body of material. In the threshold switch, the typical diameter of the body of material ranges from about 10 microns to about 400 microns. An exemplary composition of the body of material for a threshold switch is $As_{34}Te_{28}S_{21}Ge_{16}Se_1$. For the memory device, the dimensions of the body of material are typically much smaller than those of the threshold device. The diameter ranges from about 0.25 microns to about 2 microns. A commonly used composition for the body of material in memory devices is $Ge_{15}Te_{81}Sb_2S_2$.

Operationally, threshold and memory switches respond to input electrical signals very differently. The threshold switch starts out in a high ohmic state and stays in this state until a signal voltage greater than the switch's "threshold" voltage is received. When this threshold voltage is reached, the switch will drop to a lower ohmic state and stay in this state until the current through the switch drops to a minimum holding value. In contrast thereto, when a memory switch is "set" to a low ohmic state, the switch remains in that state until another electrical signal "resets" the switch to its high ohmic state.

These operation differences stem from the compositional differences of the body of material forming the switch. Each of the materials for a threshold and memory switch has an amorphous atomic structure in its high ohmic state. However, in its low ohmic state, the memory switch's material is crystalline/polycrystalline, while the threshold switch's material does not crystallize. Therefore, once the current flowing through the switch drops, the threshold switch reverts automatically to its high ohmic state, while the memory switch remains in its low ohmic (crystalline) form. To revert the memory switch to its high ohmic (amorphous) state, another electrical signal of higher voltage is required.

Many different combinations of atomic elements, when combined in the proper proportions and fabricated in the prescribed manner, have been shown to inherently produce a chalcogenide material having the aforementioned threshold or memory switching characteristics. Examples of such chalcogenide materials and switching devices fabricated therewith, are found in the following list of U.S. patents, all of which are assigned to the assignee of the present invention, and all of the disclosures of which are hereby incorporated by reference:

| LIST OF PATENTS TO BE INCORPORATED BY REFERENCE | |
|---|---|
| 3,271,591 | 3,611,063 |
| 3,343,034 | 3,619,732 |
| 3,571,669 | 3,656,032 |
| 3,571,670 | 3,846,767 |
| 3,571,671 | 3,875,566 |
| 3,571,672 | 3,886,577 |
| 3,588,638 | 3,980,505 |

Also incorporated herein by reference is the disclosure of commonly assigned U.S. patent application Ser. No. 07/642,984, filed on Jan. 18, 1991, entitled "Electrically Erasable Phase Change Memory".

While the aforementioned list of patents and application are representative of some known chalcogenide switching materials and device configurations, they are, by no means, inclusive of all possible materials and device structures. When used herein, the term "chalcogenide material" should not be limited to those switching materials disclosed and/or incorporated by reference, but is intended to refer to any thin-film chalcogenide alloy material capable of being used as switching devices when ohmic contacts are formed thereacross.

After extensive investigation and failure analysis of prior art device structures and fabrication processes, it has been determined that each prior art device/process contains inherent design weaknesses which reduce the yield of usable devices and repeatability of the electrical switching characteristics of these devices. These weaknesses can be grouped into three categories: a) poor step coverage of the oxide material when non-planarized structures are used; b) unreliable switching due to edge conductivity; and c) contamination of the active body of thin-film chalcogenide material.

Poor step coverage or thinning of the active body of chalcogenide material over the deposited layers of insulating material results in variability of the electrical switching characteristics of the device. This variability in switching characteristics is due to the requirement that the body of active chalcogenide material must cover a layer of insulating material that is thick enough not to break down when the voltage is applied thereacross. The step coverage problem must be solved while bearing in mind the fact that the amorphous chalcogenide materials are incompatible with most conventional semiconductor processing techniques heretofore used to alleviate such a problem. An example of such a chalcogenide switching structure which suffers from poor step coverage is shown in commonly assigned U.S. Pat. No. 4,809,044 to Pryor, et al., the disclosure of which is hereby incorporated by reference.

Figure 1:
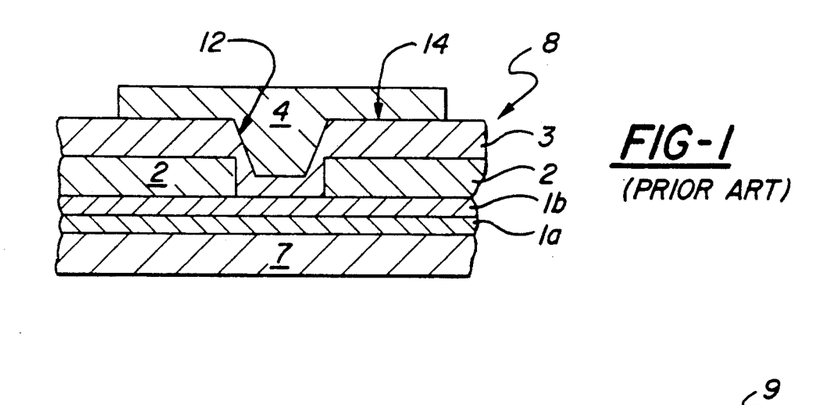
FIGS. 1 through 3 are enlarged cross-sectional side views, partially cut-away, illustrating structures by which the thin-film switching devices of the prior art are fabricated and specifically intended to demonstrate the inherent weaknesses peculiar to each design.

Switching of chalcogenide material due to edge conduction is caused by filamentary conduction paths which are not restricted from the perimeter of the pore in which the chalcogenide material is contained. Note that in such a structure the opposite surfaces of the body of chalcogenide material are contacted by first and second electrodes, respectively. The electrical current supplied by a source travels along a path of least resistance defined as that path from the first electrode along the periphery of the body of chalcogenide material to the edge of the second electrode. Such edge conduction results, by definition, in current shunting at the structure's perimeter thereby short-circuiting the device. In the extreme, the electrically conductive material at the edge of the second electrode (such as molybdenum) can be driven into the body of chalcogenide material, thereby forming a permanent conduction path. An example of a device structure which can suffer from edge conduction is shown in FIG. 1, which structure will be described in detail hereinafter.

In another problem initiated by prior art fabrication techniques, the upper surface of the active chalcogenide material can become contaminated by the etching procedure in which the opening (also synonymously referred to hereinafter as a "pore" or "via") in the lower layer of insulator material through which the upper electrode or external contact electrically communicates with the body of chalcogenide material is produced. This contaminated portion of chalcogenide material can result in variability of the electrical switching characteristics of a device fabricated therefrom and/or breakdown of that device due to changes in the composition of the chalcogenide switching material. Efforts to remove this contaminated portion typically results in electrical variation due to stoichiometry and thickness changes of the body of said active chalcogenide material.

Accordingly, one of the principal objects of the present invention is to fabricate an improved structural arrangement of the plurality of thin-film layers of the chalcogenide electrical switching devices of the instant invention which overcomes the aforementioned design weaknesses.

SUMMARY OF THE INVENTION

In light of the foregoing object, it is a first object of the present invention to provide a solid state thin-film switching device which includes a pair of spaced-apart electrodes between which is interposed and electrically connected, a body of chalcogenide switching material (a memory switch or a threshold switch depending on choice of chalcogenide material). The chalcogenide switching device of the present invention includes a substrate, a first electrode disposed on the substrate and a relatively thin layer of electrically insulating material disposed on the first electrode, the thin layer of insulating material defining an opening through which a first surface of the central portion of the body of chalcogenide material electrically communicates with the first electrode. The thin layer of insulating material is sufficiently thick to prevent the direct conduction of electrical current from the first electrode along the peripheral surface of the body of chalcogenide material to the second electrode, but not so thick as to cause step coverage problems during the deposition of the body of chalcogenide material. A second electrode is placed in electrical communication with the body of chalcogenide material at the surface of the chalcogenide material opposite that surface which is in direct communication with the first electrode. A relatively thick layer of electrically insulating material then covers at least the periphery of the body of chalcogenide material.

Another object of the present invention is to provide a method for fabricating the aforedescribed solid state thin-film chalcogenide switching device. The method includes the steps of providing a substrate, depositing a first electrode on the substrate, and depositing a relatively thin layer of electrically insulating material on the first electrode. The thin layer of insulating material is formed so as to define an opening communicating with the first electrode. After forming the opening, a body of chalcogenide material can be deposited on the thin insulating layer such that a first surface of a central portion of the body of chalcogenide material fills the opening and electrically communicates with the first electrode, the thickness of the layer of insulating material being sufficient to prevent direct electrical conduction from the first electrode along the periphery of the body of chalcogenide material to the edge of a second electrode, but not so thick as to cause step coverage problems during the deposition of the chalcogenide material. A second electrode is then deposited on the surface of the body of chalcogenide material opposite that of the first electrode, and finally, a relatively thick layer of electrically insulating material is formed on at least the peripheral surface of the body of chalcogenide material.

The device structure and fabrication process of the present invention effectively overcome the aforedescribed design weaknesses which are inherent in the prior art structures and fabrication processes. Other aspects, objects, features and advantages of the present invention will become apparent from the subsequent description and the appended claims taken in conjunction with the accompanying drawings. Although the detailed description of the invention as set forth below specifically describes the production and design structure of threshold switches, one ordinarily skilled in the art would recognize that the basic difference between threshold switches and memory switches, and arrays made therefrom, resides predominantly in the particular chalcogenide material used as the switching material. Therefore, the present invention and detailed description are equally applicable to memory switches.

DETAILED DESCRIPTION OF THE DRAWINGS AND PREFERRED EMBODIMENTS

Figure 2:
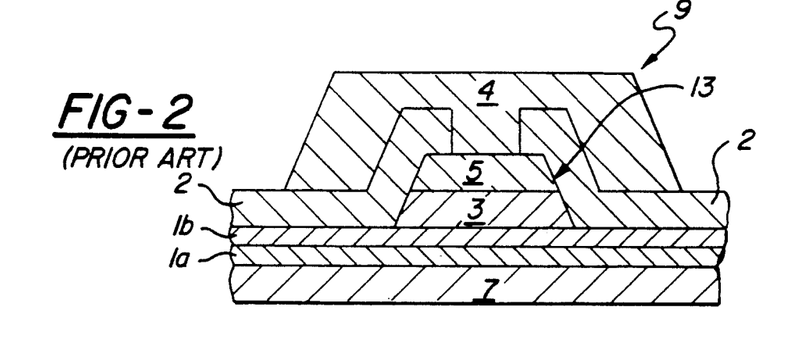
Figure 3:
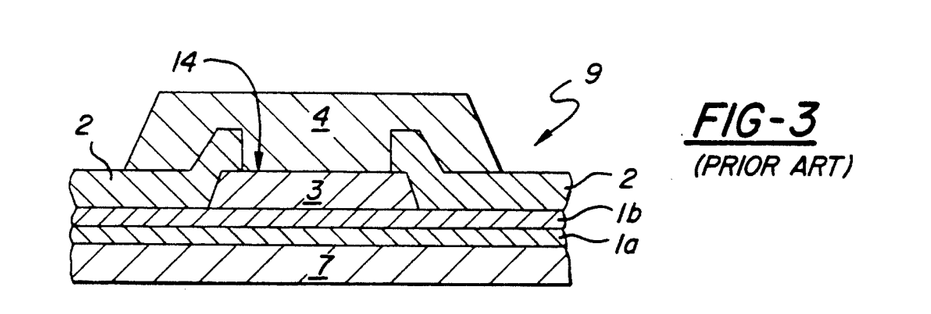

Turning now to the drawings and, particularly, to FIGS. 1 through 3, there are depicted therein cross-sectional side views of three prior art chalcogenide switching devices 8, 9 and 10, respectively. In each of these figures, like elements have been assigned identical reference numerals. Each device includes a substrate 7 on which there is formed a dual layered electrode 1. Each device also includes a body of chalcogenide material 3 which acts as a switch (memory or threshold, depending upon the compositional and electrical characteristics of the particular chalcogenide material employed), a thick layer of electrically insulating material 2, and an uppermost electrical contact and heat sink 4. Device 9 (see FIG. 2) additionally includes an upper layer of electrode material 5 operatively disposed above the body of chalcogenide material 3. Each of the switching devices 8, 9 and 10 demonstrate, in actual use, one or more of the shortcomings in structural design which eventually are manifested as an electrical failure.

The switching device 8, depicted in FIG. 1, demonstrates multiple design weaknesses in the structural characteristics thereof. The points at which these design weaknesses most readily manifest themselves are indicated by the reference numerals 12 and 14. Reference numeral 12 depicts the portion of the body of chalcogenide material 3 which suffers from poor "step coverage" which is defined as thinning of the active material over the step formed at the inner annulus of the relatively thick layer of insulating material. Reference numeral 14 depicts the upper surface of the body of chalcogenide material 3 along the interface thereof with the external contact 4. It is at this interface that the chalcogenide material can become contaminated from, for instance, the molybdenum contact and thereby initiate erratic switching.

Turning now to FIG. 2, the switching device 9 illustrated therein suffers from edge switching which occurs along the canted periphery of the body of chalcogenide material 4. This edge switching is depicted by reference numeral 13. The prior art switching device 10, depicted in FIG. 3, suffers from contamination of the upper surface of the body of chalcogenide material 3 at the interface thereof with the external contact 4. This contamination was described in detail with specific reference to FIG. 1 and need not be repeated relative to the FIG. 3 embodiment.

Figure 4:
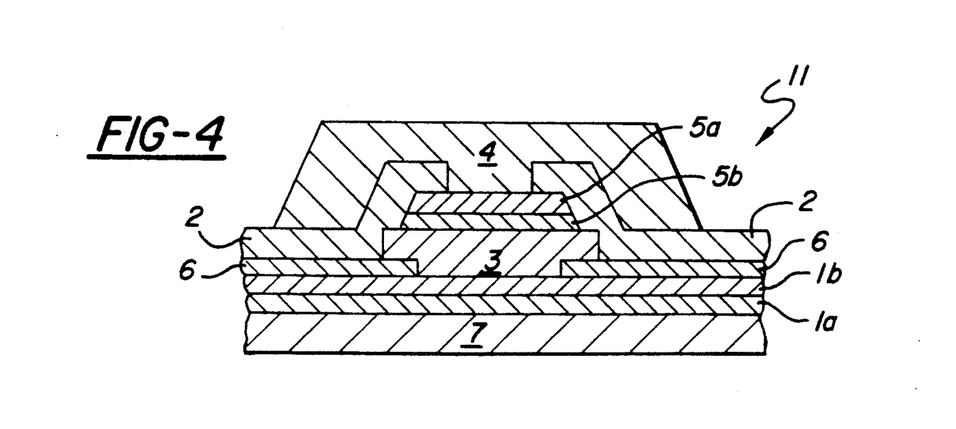
FIG. 4 is an enlarged cross-sectional side view, partially cut-away, illustrating the solid state thin-film chalcogenide switching device structure of the present invention.

Referring now to FIG. 4, there is shown an electrical switching device 11 of the present invention which utilizes a pair of electrically switching conductive films of carbon material, 1b and 5b, respectively, as barrier layers between which is disposed the central body of chalcogenide material 3 and upper and lower metallic electrodes (as, for example, molybdenum) 1a and 5a. Each film of carbon material forms part of the electrode adjacent to which it is operatively disposed. The device 11 is formed on a substrate 7 which may be electrically conductive or insulating as required for the specific application in which the device will be employed. Stainless steel, copper, aluminum, and doped crystalline silicon are examples of suitable electrically conductive substrates; while glass, crystal silicon and crystal sapphire wafers are examples of suitable electrically insulating substrates. Successively deposited atop the substrate 7 are a layer 1a of electrode material, such as molybdenum, a thin film 1b of carbon, a thin layer of insulating material 6 which defines a centrally located opening, a body 3 of chalcogenide material, a thin film 5b of carbon, a top layer of electrode material, such as molybdenum, a thick layer of insulating material 2, and an external contact 4.

The electrodes 1a and 5a are preferably formed of molybdenum, although any other suitable highly conductive material known to routineers in the art, preferably those with high melting points and which are relatively inert with respect to the body of chalcogenide material 3, such as tantalum, niobium, tungsten, and tantalum-tungsten alloys. The thin films 1b and 5b are preferably fabricated of an electrically conductive, phase-stable, non-switching carbon material. The thin film of carbon 1b is operatively disposed in intimate electrical contact with the lower electrode 1a and with the lower surface of the body of chalcogenide material 3. The thin film of carbon 5b is operatively disposed in intimate electrical contact with the upper surface of the body of chalcogenide material 3 and with the upper electrode 5a.

The electrodes 1a and 5a may be deposited using any conventional technique, such as sputtering, evaporation, vapor deposition or the like. Preferably in threshold switches, the electrodes are formed as thin films of amorphous materials by maintaining the temperature of the surface upon which they are deposited sufficiently cool, so that the atoms condense into a generally disordered or amorphous state upon contacting said surface.

The thin films of carbon 1b and 5b are preferably deposited using DC magnetron sputtering. Typical process parameters are a substrate temperature of about 100° C., a pressure of about 0.5 Pascal, a deposition rate of about 200–300 Angstroms per minute, and a distance of approximately 6 cm between the source and target. The resultant thin films of carbon are generally amorphous (a-carbon). Preferably, a carbon source is used so that the resultant films, deposited onto the substrate and the body of chalcogenide material, are substantially pure carbon. As used herein, pure carbon source means a source of material that is at least 99.9 percent carbon and preferably is 99.99 percent or more pure carbon. When amorphous carbon is sputtered under these conditions, it may exhibit an electrical resistivity as low as about 0.025 ohms-centimeters.

More detailed information about the process for sputtering such conductive thin films of substantially amorphous carbon and the electrical and structural characteristics of such films is provided in N. Savvides, "Four-Fold to Three-Fold Transition in Diamond-Like Amorphous Carbon Films: A Study of Optical and Electrical Properties", *Journal of Applied Physics*, Vol. 58, No. 1, pp. 518–521 (July, 1985), the disclosure of which is incorporated herein by reference.

The active body of chalcogenide material 3 may be deposited using any conventional technique known to those ordinarily skilled in the art. The preferred threshold switching material from which to fabricate said body 3, illustrated in the FIG. 4 device, is an amorphous alloy including one or more chalcogenide elements, i.e., sulphur, selenium tellurium, and arsenic. (However, any type of semiconductor material which exhibits memory or threshold switching behavior may also be used without departing from the spirit and scope of the present invention.)

The preferred compositions for the respective layers 1a, 1b, 3, 5a and 5b of device 11, when said device is to be used as a thin-film threshold switching device, are specified in Table 1 below. Table 1 lists exemplary materials and exemplary thickness ranges for the switching device. A typical thickness for the respective layers of a sample device as constructed and tested pursuant to the enabling embodiment of the instant invention are also given.

TABLE 1

| Reference Numeral | Exemplary Material | Range of Thickness | Typical Thickness (Angstroms) |
|---|---|---|---|
| 1a | Molybdenum | 1,500–25,000 | 5,000 |
| 1b | a-Carbon | 100–10,000 | 2,800 |
| 3 | $As_{34}Te_{28}S_{21}Ge_{16}Se_1$ | 100–50,000 | 10,000 |
| 5b | a-Carbon | 100–10,000 | 2,800 |
| 5a | Molybdenum | 1,500–25,000 | 5,000 |

As indicated in Table 1, the layers 1a, 1b, 3, 5a and 5b of device 11 are preferably fabricated as thin-films, under a micron in thickness. As used herein, the term "thin-film" typically refers to a layer of deposited material having a total thickness of less than 5 microns, and preferably less than 1 micron. Those of ordinary skill in the art will appreciate, however, that for certain applications, it is possible to scale up the indicated thicknesses of the preferred embodiments of the present invention so that at least some of the layers, such as the chalcogenide layer 3 or electrode layers 1a and 5a, may be thicker than 5 microns. The thickness of the chalcogenide layer 3 is related to the specified use desired, and may be adjusted in a manner well understood in the art. The thickness of the various thin films used in the device illustrated in FIG. 4 may be readily controlled and, therefore, deviations from the preferred ranges set forth herein may occur without departing from the spirit or scope of the instant invention.

In operation of the switching device 11, electrical current delivered to the first molybdenum electrode thereof passes through at least one portion of the first layer of carbon, through at least a filamentary pathway formed through the body of chalcogenide material and through the second thin film of carbon to the second molybdenum electrode. The thin layer of insulating material 6 prevents the current from traveling along the peripheral portion of the chalcogenide material, thereby preventing current from being shunted about the surface of the body due to the aforementioned problem of edge conduction.

The layers of insulating material 2 and 6 may be fabricated of a variety of thin film dielectric materials, such as silicon oxide ($Si_xO_y$), silicon oxynitride ($SiO_xN_y$), silicon carbide, silicon oxycarbide, or, preferably, silicon nitride ($Si_xN_y$). The thick layer of insulating material 2 may range in thickness from about 0.15 to 10.0 microns depending in part upon the thickness of the body of chalcogenide material 3 and the thickness of the thin layer of insulating material 6. The thin layer of insulating material 6 may range in thickness from about 0.01 to 1.0 microns depending again upon the thickness of the body of chalcogenide material 3. The preferred thicknesses of the layer 6 and layer 2, respectively, are about 0.1 microns and about 1 micron for a body of chalcogenide material having a thickness of about 1 micron. After layers 2 and 6 have been deposited, conventional photolithographic and etching techniques are used to develop openings (or vias or pores) in the electrically insulating material. When deposited, the body of chalcogenide material 3 is in indirect electrical communication with the layer of carbon 1b through the opening created in layer 6. An external contact 4 contacts and electrically communicates with the upper electrode 5a through the opening developed in the thick layer of insulating material 2. The external contact 4 may be patterned so as to provide a plurality of conductive address lines, thereby allowing access to a matrix of discrete electrical devices. The layer 1a, as well as the contact 4, may be electrically connected to other thin film devices operatively disposed on the same substrate or to terminal pads (not shown) for ease of connection to the switching device. The etching of the various thin film layers described herein may be accomplished using conventional etchants, either wet or dry, known to those ordinarily skilled in the semiconductor processing art.

A preferred process for producing the multi-layered structure of the switching device 11 of the instant invention is set forth hereinafter. Single crystal silicon is chosen for the substrate 7, said silicon being etched with a fluorine containing compound to cleanse the surface thereof. The multi-layers, molybdenum 1a and carbon 1b, which form the first electrode are then sequentially deposited upon the substrate by sputtering. The thin layer of insulating material 6, such as silicon nitride, is then deposited by Plasma Enhanced Chemical Vapor Deposition (PECVD). Photolithographic patterning is then employed so as to form a centrally located opening through the thin layer of insulating material. The photoresist is stripped therefrom and the substrate, with its deposited layers, is degassed at high temperature in a vacuum. The body of chalcogenide material 3 can then be deposited, by sputtering, such that the central portion of the body of chalcogenide material is placed in direct contact and electrically communicates with the layer of carbon 1b through the opening which has previously been formed in the thin layer of insulating material. Next, the upper layer of carbon 5b and the upper layer of molybdenum 5a, which combine to form the upper electrode, are sequentially deposited by sputtering and then photolithographically patterned. The layer of molybdenum is etched, the photoresist is stripped and the layer of carbon is etched, thereby forming the electrode. The body of chalcogenide material is photolithographically patterned and etched and the photoresist is stripped. Next, the thick layer of insulating material 2 is deposited by PECVD, patterned with photoresist, and an opening therethrough is etched. The remaining photoresist is stripped and the external contact is deposited thereon. As mentioned earlier, the external contact may be patterned with photoresist, etched and stripped to provide discrete electrically conductive address lines, thereby allowing access to the matrix of discrete electrical switching devices. Since techniques for depositing materials by sputtering, PECVD or evaporation and photolithographic patterning/etching are well known in the relevant art, further details of same need not be provided here.

In the preferred embodiment of the instant invention, it is desirable to provide an appreciable mass of thermally conductive material in intimate thermal contact with the upper and/or lower electrodes of the switching device for maximum dissipation of heat generated during device operation, especially when said devices are employed for high energy applications. This provides a thermal heat sink which helps avoid localized concentrations of elevated temperature which may, in the most aggravated instances, result in ablation of the body of chalcogenide switching material or layers of electrode materials adjacent to a local "hot spot." Those routineers skilled in the art will appreciate that a relatively thick, highly thermally conductive substrate, and a thick external electrical contact layer of heat sink material 4 (whether patterned or continuous) will greatly help in the dissipation of heat. For some applications, it may be sufficient to provide such heat dissipation material on only one side of the switching device, such as the substrate side. However, it is preferred. when possible, to provide such heat dissipation material on all electrode surfaces directly contacting or adjacent portions of the body of chalcogenide material 3.

When the substrate 7 is fabricated from an electrically conductive. high thermally conductive material (such as metal) and integration is required, it is preferable to provide an electrically insulating surface material (such as deposited diamond. silicon oxynitride, beryllium oxide, alumina, sputtered quartz or the like). which insulating material is characterized by relatively good thermal conductance properties, so that heat is relatively efficiently transferred from the body of chalcogenide material 3 to the substrate 7, which substrate can then serve as a heat sink. The thickness of this layer of thermally insulating material is preferably 100 to 500 Angstroms thick, and more preferably 250–450 Angstroms thick. The optimum thickness depends on the dielectric qualities of the insulating material chosen, as well as the potential thermal difference experienced by the substrate 7 and the body of chalcogenide material 3 during operation of the switching device.

In the foregoing discussion of the preferred embodiment of the present invention. the switching device was fabricated with two layers of thin-film carbon which served as barriers when operatively disposed between the threshold switching material and the more conductive layers of electrode material. such as the layers $1a$ and $5a$ in FIG. 4. It is to be noted that the use of such thin films of carbon is preferred when the switching device must demonstrate long term highly stable electrical switching characteristics. In particular, the thin films of carbon are believed to provide a superior barrier between the body of chalcogenide material and the molybdenum, i.e., prevent the diffusion of molybdenum atoms into the chalcogenide material adjacent thereto during d.c. operation. However, it is well known that switching devices fabricated of chalcogenide material, but without such carbon barriers, work satisfactorily, especially during alternating current operation. Accordingly, it is to be appreciated that the switching devices may be made without such thin film carbon barriers without departing from the spirit or scope of the instant invention. In such embodiment, the electrodes, such as layers $1a$ and $5a$, would be in direct contact with the body of chalcogenide switching material. The amorphous carbon material disclosed above can be readily deposited with almost any desired resistivity by adjusting the sputtering power density. Other barrier materials known to those of ordinary skill in the art, and which are substantially inert with respect to the body of chalcogenide material 3, and which have (or can be modified to have) a desired resistivity, may be used in place of the carbon in said layers $1b$ and $5b$.

Although amorphous chalcogenide switching materials are preferred for use in the present invention. any other switching material may be used, provided it can be suitably deposited or otherwise incorporated into the switching device. It is the dual insulating layer and not the specific type of switching material which forms the basis of the invention disclosed herein.

Substantially amorphous molybdenum has been disclosed above as a preferred material from which to fabricate the intermediate electrodes $1a$ and $5a$ of the illustrated switching device. Other electrically conductive materials may be substituted therefore, provided they are compatible with the chalcogenide switching material, the insulating material and the electrode materials used in the device. For example, switching devices made with amorphous chalcogenide switching material may also utilize electrodes made of tantalum, graphite, niobium refractory metal oxides, carbides and sulphides. Preferably, such electrode materials may be deposited using vacuum techniques in a substantially disordered, generally amorphous condition so there is no tendency for the amorphous chalcogenide material to assume a crystalline-like state. Further, a compatible, relatively low temperature (under 450° C.) deposition technique is essential otherwise subsequently formed materials will crystallize the chalcogenide alloy.

A passivation layer of any suitable insulating material is preferably deposited over the structure to provide protection against environmental contamination and/or unintended electrical contact with other devices or circuits. It is preferred to use a material for this passivation layer characterized by a high coefficient of thermal conductivity so that a second heat sink is placed in intimate physical contact therewith to provide additional heat dissipating capabilities. This, once again, is significant due to the relatively low crystallization temperature of the chalcogenide material. A disk or thin sheet of aluminum, silver, silicon-based liquid, or synthetic oil material are exemplary heat sink materials. Such heat sink designs are well know to those of ordinary skill in the art and, thus, need not be described further here.

The switching device of the present invention may be deposited directly atop an existing microelectronic circuit and electrically connected thereto. The thin-film switching device of the present invention can be manufactured by mass production methodology so as to fabricate thousands of units on top of a single integrated circuit (IC) chip or crystalline wafer containing many such chips. Thus, the instant switching device can be economically made an integral part of IC chips by the chip manufacturer. Alternatively, said switching devices can be simultaneously mass-produced on a single large area (e.g., 100 to 1,000 cm$^2$) substrate, such as thin sheets of stainless steel with (or without) a thin layer of insulating material, synthetic plastic web materials, or glass, using batch processing techniques for making integrated solid-state devices. The substrate may be subsequently diced into groups of devices or individual devices for packaging in conventional fashion in canisters or chip carriers, for sale as discrete devices. Such packages may also be provided with conventional heat sink capability so as to improve the ability of the packaged device to dissipate heat. Special packages could also be designed to allow said switching devices to be readily incorporated into electrical connectors and the like.

Switching devices fabricated from prior art structures 9, as illustrated in FIG. 2, and of the structures of the instant invention were tested for yield of usable devices after cycling and for reproducibility of electronic switching characteristics after cycling at different electrical inputs.

Figure 5A:
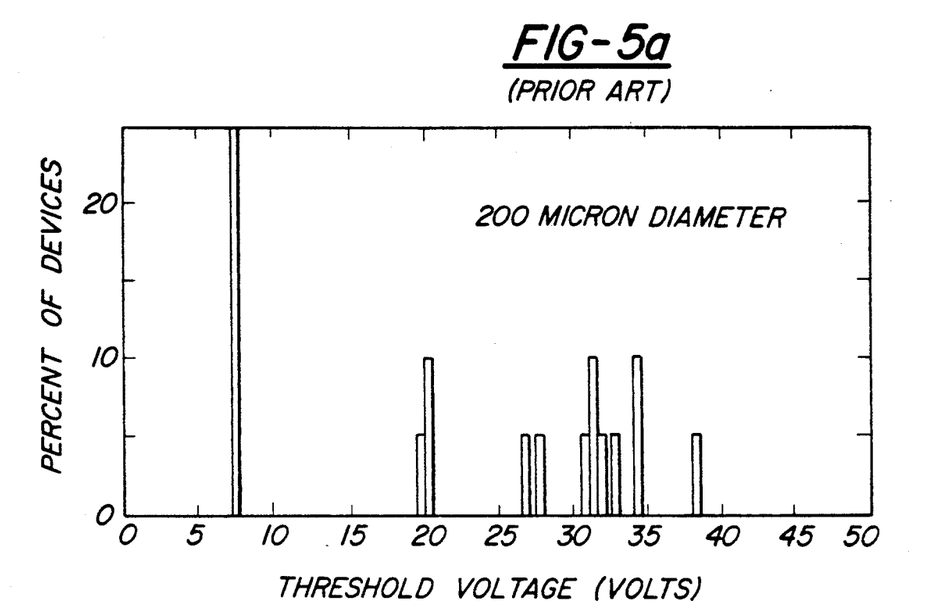
FIGS. 5a and 5b are graphical representations with threshold voltage plotted on the abscissa, and percentage of devices characterized by that threshold voltage plotted on the ordinate, for the prior art devices of FIGS. 1–3, and the inventive device of FIG. 4, respectively.
Figure 5B:
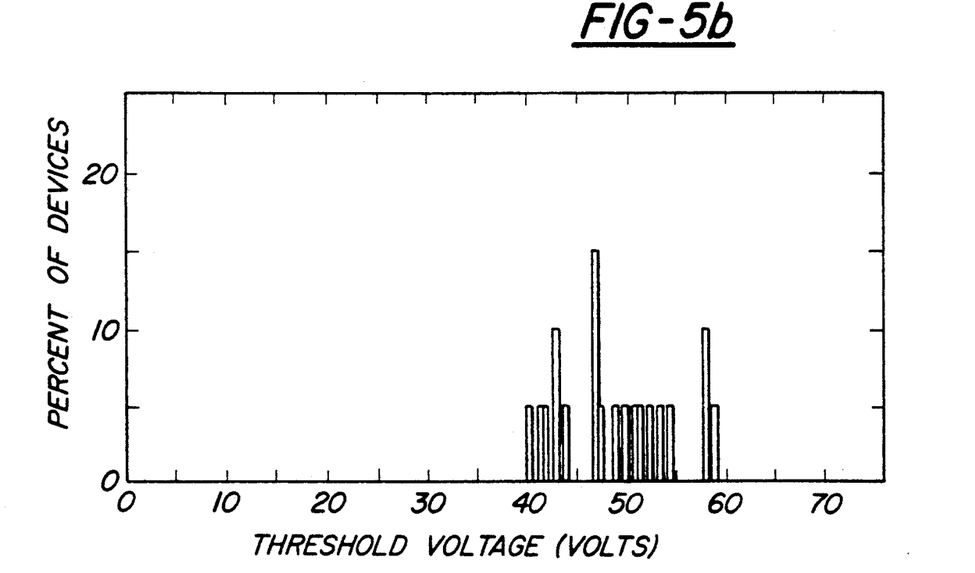

FIGS. 5a and 5b graphically depict the threshold voltage plotted on the abscissa, in volts, of 200 micron diameter chalcogenide switching devices, averaged over hundreds of cycles, versus the percentage of those devices having that threshold voltage, on the ordinate, for the device structures of the prior art and the instant invention, respectively.

As can be seen from a perusal of FIG. 5a, the prior art switching devices vary widely in the threshold voltage thereof (i.e., poor reproducibility of electronic switching characteristics from one device to another). Additionally, a large percentage of the switching devices of the prior art demonstrated extremely low threshold voltages indicating edge switching thereof. However, as can be seen from a perusal of FIG. 5b, the switching devices of the instant invention are characterized by a much narrower range of threshold voltages and no indication of edge switching. This provides an excellent indication of the improved electrical characteristics exhibited by the switching devices fabricated according to the structure set forth herein, since both the prior art devices and the devices of the instant invention were made with identical switching material.

Figure 6A:
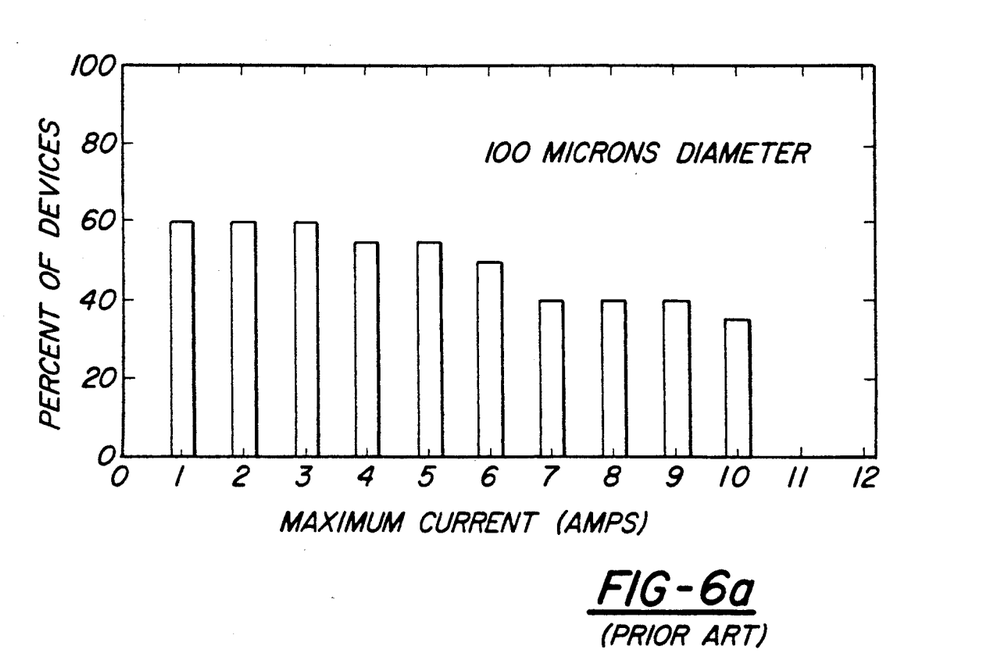
FIGS. 6a and 6b are graphical representations with maximum current through the switching devices plotted on the abscissa and the percentage survival (yield) at that amperage plotted on the ordinate for the prior art devices of FIGS. 1–3, and the inventive device of FIG. 4, respectively.
Figure 6B:
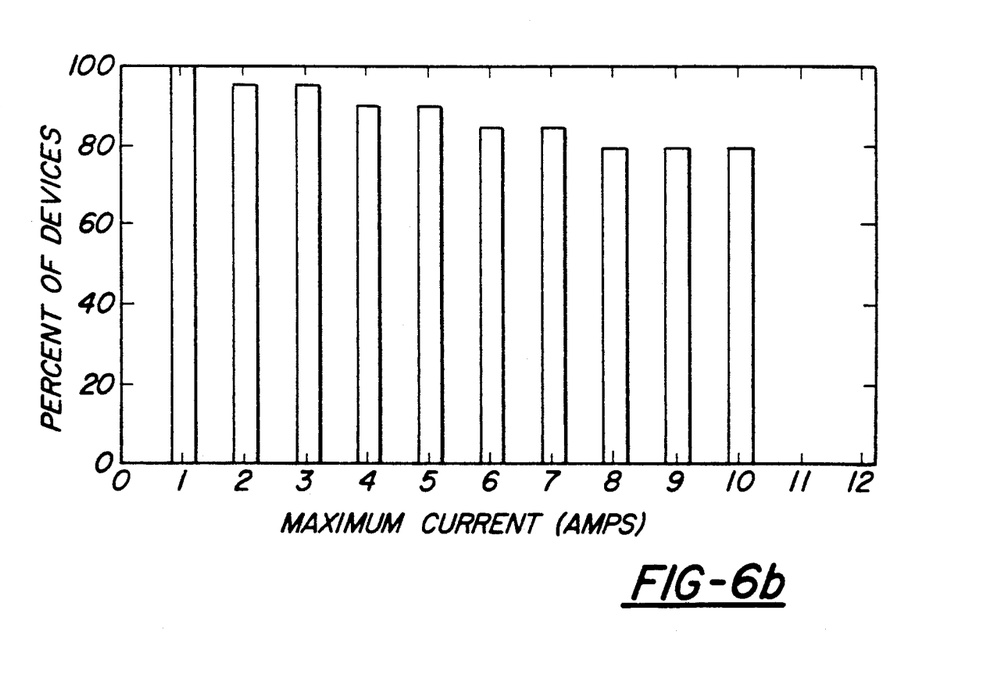

FIGS. 6a and 6b graphically depict the maximum current in amps, employed to switch 100 micron diameter chalcogenide switching devices versus the percentage yield of those devices surviving that amperage, on the ordinate, for the device structures of the prior art and the instant invention, respectively. In this test, the respective devices were pulsed at the indicated amperage. Then, the devices were tested to determine whether the threshold voltages thereof had dropped below a minimum acceptable value. If the threshold voltage did fall below the minimum value, the devices would be considered to have failed. If the threshold voltage remained above the minimum value, the devices received another pulse/test cycle. Twenty cycles were run at successively higher integral values of amperage. In other words, those switching devices which survived one amp pulses were cycled next at two amps, and so forth, up to ten amps.

As can be seen from a perusal of FIG. 6a, 40% of prior art devices failed (60% yield) when tested at the lowest current, which correlates to problems of edge switching, as detailed hereinabove. This failure percentage increases to 65% (35% yield) when tested at higher currents. However, as can be seen from a perusal of FIG. 6b, when tested at the lowest current, none of the switching devices of the instant invention showed any indication of failure due to edge current switching (100% yield) and only 20% of the devices (80% yield) failed when tested at the highest current.

Therefore, when tested under identical conditions, the device structures of the instant invention were characterized by remarkably increased yield, as well as significantly improved reproducibility of electrical properties, vis-a-vis, the prior art device structures.

Having thus described the preferred embodiments of the present invention, it is recognized that those skilled in the art may make various modifications or additions to said preferred embodiment, which was merely chosen to illustrate the present invention, without departing from the spirit and scope of the present contribution to the art. Additionally, and as previously stated, although the detailed description of the preferred embodiment set forth above, describes parameters and design structure for producing a threshold switching device, one ordinarily skilled in the art would readily recognize that the basic difference between threshold switches and memory switches resides predominantly in the particular chalcogenide material used in fabrication of the switching device and, therefore, the scope of the present invention additionally includes memory switches. It is to be understood that within the scope of the appended claims, the invention can be practiced otherwise than specifically described.

We claim:

1. A solid state thin-film switching device including a pair of spaced-apart electrodes between which is operatively disposed in electrically communicative relationship, a body of chalcogenide material, said device including:
    a substrate;
    the first electrode on said substrate;
    a relatively thin layer of electrically insulating material on said first electrode;
    an opening in said thin layer of insulating material through which a first surface of a central portion of said body of chalcogenide material electrically communicates with said first electrode, said body covering a portion of the upper periphery of said opening in said thin layer of insulating material;
    the second electrode on a second surface of said body of chalcogenide material;
    said thin layer of insulating material being sufficiently thick to prevent direct conduction of electric current between said first electrode, along the periphery of said body of chalcogenide material, and said second electrode, but not so thick as to cause step coverage problems during the deposition of said body of chalcogenide material; and
    a relatively thick layer of electrically insulating material covering at least the periphery of said body of chalcogenide material, said thick layer of insulating material being non-coextensive with said thin layer of insulating material.

2. The device of claim 1, further including an external contact electrically communicating with said second electrode, said external contact also serving as a heat sink.

3. The device of claim 1, wherein said substrate is characterized by a high coefficient of thermal conductivity.

4. The device of claim 3, wherein said substrate includes a layer of electrically insulating material thereupon so as to substantially prevent current flow between said first electrode and said substrate.

5. The device of claim 4, wherein said substrate is formed of a conductive metal.

6. The device of claim 3, wherein said substrate is formed of an electrically insulating material selected from the group consisting of deposited diamond, quartz, sapphire, and single-crystal semiconductor material.

7. The device of claim 1 wherein the insulating material of each of said thin layer of insulating material and said thick layer of insulating material is selected from the group consisting of electrically insulating oxides, nitrides, carbides, oxycarbonitrides, oxycarbides, oxynitrides, and combinations thereof.

8. The device of claim 7, wherein the compositions of said thin layer of insulating material and said thick layer of insulating material are the same.

9. The device of claim 7, wherein the compositions of said thin layer of insulating material and said thick layer are different.

10. The device of claim 7, wherein said insulating material is formed of silicon nitride.

11. The device of claim 7, wherein said insulating material is formed of silicon oxide.

12. The device of claim 7, wherein said insulating material is formed of silicon oxynitride.

13. The device of claim 1, wherein each of said first electrode and said second electrode include a thin-film layer of refractory material disposed remote of said body of chalcogenide material and an amorphous carbon layer interposed between, and electrically communicating with, said body of chalcogenide material and said thin-film layer of refractory material.

14. The device of claim 13, wherein said thin-film refractory layer is formed of molybdenum.

15. The device of claim 1, wherein said thin layer of insulating material is less than about 10% of the thickness of said body of chalcogenide material.

16. The device of claim 1, wherein said body of chalcogenide material is threshold switching material.

17. The device of claim 1, wherein said body of chalcogenide material is memory switching material.

18. The device of claim 16, wherein said body of chalcogenide material is formed of $As_{34}Te_{28}S_{21}Ge_{16}Se_1$.

19. The device of claim 17, wherein said body of chalcogenide material is formed of $Ge_{15}Te_{81}Sb_2S_2$.

* * * * *